United States Patent [19]

Akiyama et al.

[11] 4,391,511
[45] Jul. 5, 1983

[54] LIGHT EXPOSURE DEVICE AND METHOD

[75] Inventors: Nobuyuki Akiyama; Yukio Kembo; Yasuo Nakagawa; Susumu Aiuchi; Mineo Nomoto, all of Yokohama, Japan

[73] Assignee: Hitachi, Ltd., Tokyo, Japan

[21] Appl. No.: 245,193

[22] Filed: Mar. 18, 1981

[30] Foreign Application Priority Data

Mar. 19, 1980 [JP] Japan .................................. 55-33882
Aug. 11, 1980 [JP] Japan ................................ 55-109275
Sep. 26, 1980 [JP] Japan ................................ 55-132914
Oct. 23, 1980 [JP] Japan ................................ 55-147539

[51] Int. Cl.³ ............................................ G03B 27/52
[52] U.S. Cl. ...................................... 355/40; 269/21; 279/3
[58] Field of Search ................... 355/47–49, 355/52, 73, 87, 91; 279/3; 269/21; 248/362; 425/DIG. 60; 356/371

[56] References Cited

U.S. PATENT DOCUMENTS 3,853,313 12/1974 Appenzeller et al. ............... 269/21

OTHER PUBLICATIONS

IBM Technical Disclosure Bulletin, "Flatness Controlled Wafer Clamping Pedestal", Rottmann et al., vol. 15, No. 10, Mar. 1973, p. 3016.

*Primary Examiner*—Richard A. Wintercorn
*Attorney, Agent, or Firm*—Antonelli, Terry & Wands

[57] ABSTRACT

A light exposure device and method for exposing and printing a predetermined pattern on an exposure surface of a substrate comprises measuring means for measuring curvature of the exposure surface of the substrate, a chuck including suck and hold means for sucking and holding a back surface of the substrate opposite to the exposure surface and deforming means for imparting a force to the back surface of the substrate to deform the substrate, and control means for controlling the deforming means of the chuck in accordance with the curvature of the exposure surface of the substrate measured by the measuring means such that the exposure surface of the substrate conforms to an image surface of the pattern over an entire exposure area within a predetermined allowable error.

23 Claims, 35 Drawing Figures

FIG. 1
PRIOR ART
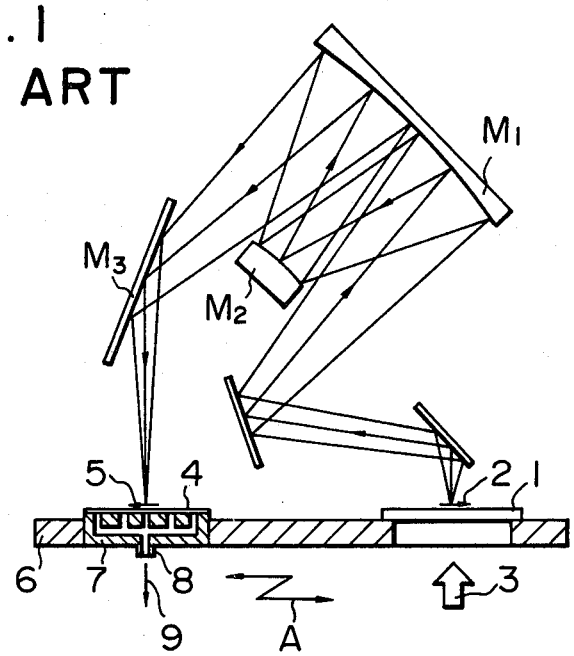
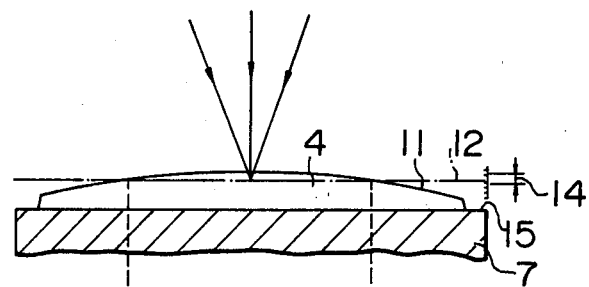
FIG. 2a
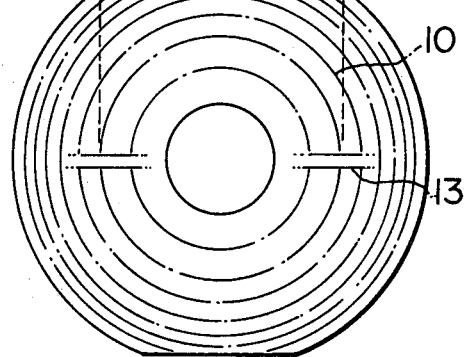
FIG. 2b

 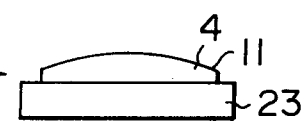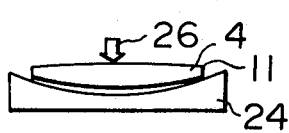 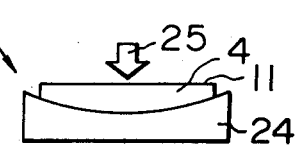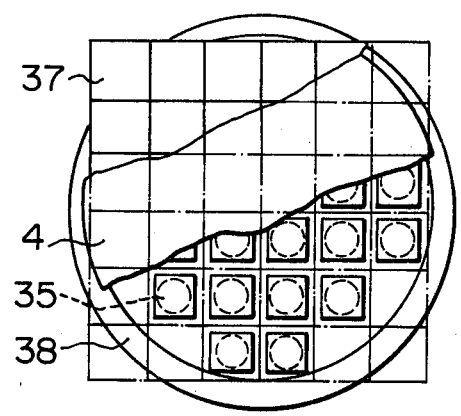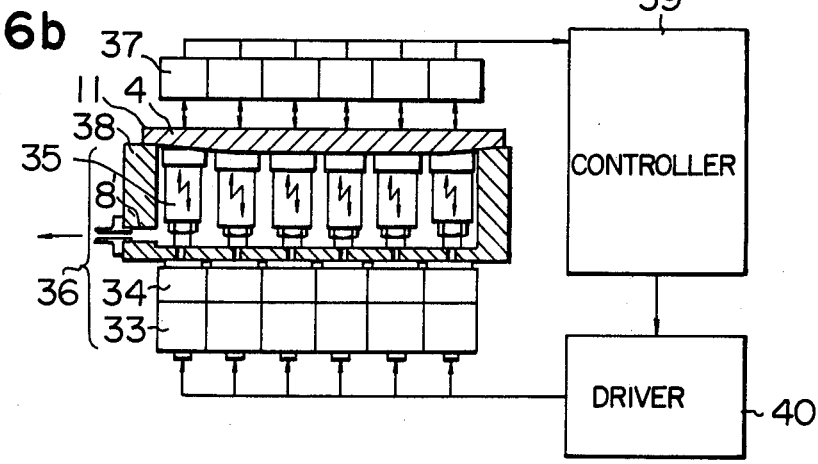

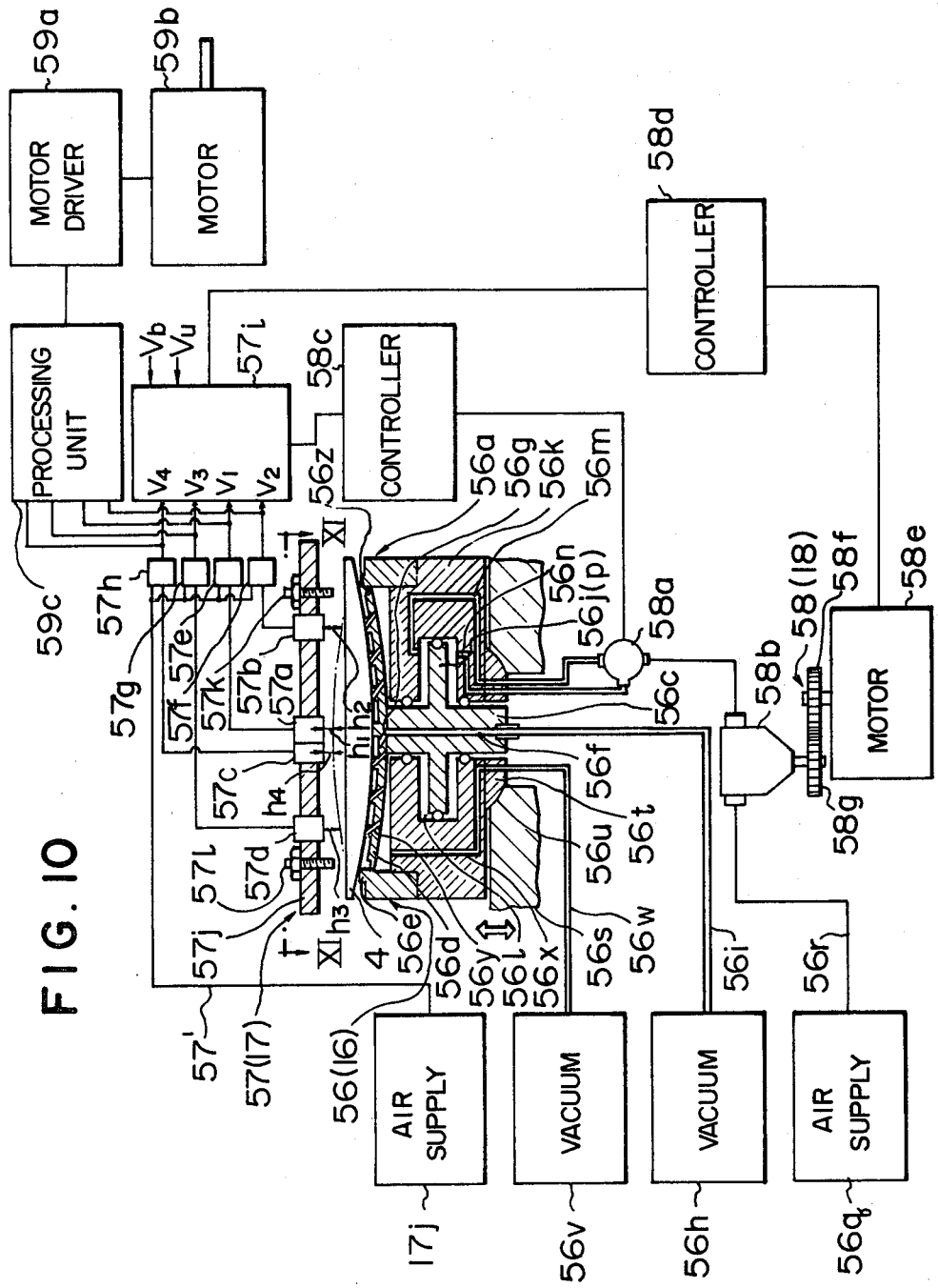

LIGHT EXPOSURE DEVICE AND METHOD

BACKGROUND OF THE INVENTION

The present invention relates to a light exposure device and a method for exposing a pattern, specifically a semiconductor IC pattern formed by photographing technique such as a mask or reticle to a substrate such as a silicon wafer, bubble wafer, ceramic substrate or a printed circuit board.

In forming an LSI pattern on a wafer, it is conventional to apply photoresist on the LSI wafer and expose a photomask pattern on the wafer to expose the photoresist thereon.

This process is called lithography and it includes contact method (in which exposure is carried out with the mask and the wafer being in contact), a proximity method (in which exposure is carried out with the mask and the wafer being spaced from each other by several microns to several tens microns) and a projection method (in which a pattern on the mask is projected onto the wafer). An X-ray exposure device has also been known.

FIG. 1 shows a construction of a projection type light exposure device as an example of the prior art light exposure devices. A pattern 2 indicated by an arrow on a surface of a mask 1 is focused to a wafer 4 by an exposure light source 3 through a minor optical system comprising a concave mirror $M_1$, a convex mirror $M_2$ and a plane mirror $M_3$. Numeral 5 denotes an imaged pattern. Periphery of the mask 1 is drawn by suction to a carriage 6 by vacuum suction means with a flatness of ±2 microns. The carriage 6 which carries the wafer 4 and the mask 1 scans reciprocally as shown by an arrow A so that the mask pattern 2 is transferred onto the wafer 4 as the carriage 6 scans. A wafer chuck 7 forms an air path to link bores formed on the top thereof to a bore 8 formed at the bottom so that the wafer 4 is drawn to the surface thereof. The bore 8 is connected to a vacuum source, not schematically represented, through a pipe shown by an arrow 9. FIGS. 2a and 2b show an enlarged sectional view and a plan view, respectively, of the wafer 4 mounted on the wafer chuck 7. In FIG. 2b, the flatness of the wafer 4 is shown by contour lines 10. In the illustrated example, the wafer 4 is spherical and protrudes upward. When the surface of the wafer 4 does not coincide with an imaging plane 12 of the optical system as shown in FIG. 2a, only a portion of a line pattern 13 (FIG. 2b) is transferred because it is imaged only to that portion of a wafer surface 11 which lies within a depth of focus 14. The depth of focus 14 on the imaging plane 12 is determined by a resolution power of the optical system necessary to the transfer, and the depth of focus at the resolution power necessary to transfer a line width of 3 $\mu$m is ±5 $\mu$m. When this depth of focus is combined with a mask positioning error of ±2 $\mu$m, an allowable depth of focus on the part of wafer is ±3 $\mu$m. When the line width to be transferred is 2 $\mu$m, the allowable depth of focus on the part of wafer is ±2 $\mu$m. On the other hand, the flatness of the wafer surface 11 sucked on the flat chuck surface 15 is normally no less than ±6 $\mu$m, sometimes more than ±10 $\mu$m. This leads to the reduction of the yield. On the other hand, the improvement of the flatness of the wafer 4 per se is very difficult to attain.

It has been proposed to focus to the wafer surface 11 in order to image and print the mask pattern on a wafer of low flatness. Referring to FIG. 3, printing of a circuit pattern on the wafer by the focusing method is explained. The wafer 4 is spherical and protrudes upward as in FIGS. 2a and 2b and it is assumed that a depth of focus covers two contour lines 10. When a scan is made in the direction of arrow A (FIG. 1) with a printing width $W_1$ without focusing, the circuit pattern is printed only to a ring-shaped area having a width $R_0$ corresponding to the depth of focus. Then, as the scan is made with the same width $W_1$ while focusing is made along the center of the width $W_1$, the pattern is printed to the range of $R_1$. Then, as the scan is made with a narrow printing width $W_2$ three times one for each of three vertically divided areas with focusing, the pattern is printed to the range of $R_3$. It is seen from the above explanation that divided exposure is best for a high yield. However, when three-division method is used, a yield or output is reduced by the factor of three resulting in a considerable amount of loss, and a joining of the individual printed patterns is very difficult to attain. Accordingly, a high precision pattern cannot be attained. Furthermore, complex mechanism and operation are required to detect focusing points and adjust focus planes. Accordingly, a cost is high and maintenance is difficult and troublesome.

While the example of LSI has been explained above, the same is equally applicable to other substrates (such as magnetic bubble substrate, thin or thick film substrate and printed circuit board).

SUMMARY OF THE INVENTION

It is an object of the present invention to provide a light exposure device which overcomes the disadvantages in the prior art devices and which uniformly exposes a mask pattern over an entire surface of a substrate under any condition with the entire surface of the substrate being uniformly spaced from the mask surface or aligned to an image plane of the mask, so that a yield of a semiconductor device, a magnetic bubble device, a thin or thick film circuit device or a printed circuit board is enhanced.

In order to achieve the above object, the present invention is characterized by measuring a contour of a curved plane of an exposure surface of the substrate and based on the measurement partially and vertically fine-adjusting the chuck which holds a back surface of the substrate to deform the exposure surface of the substrate to conform to the image plane of the mask pattern and exposing the predetermined pattern to the deformed exposure surface of the substrate to print the pattern.

Since the flatness of ±2 $\mu$m is attained in the light exposure mask when the periphery thereof is acted upon by a suction of a vacuum, the flatness of the exposure surface of the substrate source (wafer) is measured, and based on the measurement, the chuck which holds the back surface of the substrate is partially fine-adjusted vertically (in the direction of illumination of exposure light) to deform the substrate so that the flatness of the substrate which assures a depth of focus not more than ±3 $\mu$m over the entire area of the exposure surface of the substrate is attained, and the desired semiconductor IC pattern is exposed to the flattened exposure surface of the substrate with a high resolution power to print the pattern.

In an X-ray exposure mask, because the mask is very thin, it is impossible to flatten the mask by making it follow the curvature. In addition, the light source is a point light source. Thus, in order to attain high precision printing, it is necessary to keep a variance of a spacing between the surface of the mask pattern and the exposure surface of the substrate within approximately ±1 μm over the entire exposed area. Accordingly, in the X-ray exposure device, it is also very effective to partically and vertically fine-adjust the chuck which holds the back surface of the substrate or the wafer to deform it so that the spacing between the exposure surface of the substrate and the mask pattern surface is constant over the entire exposed area.

In accordance with the present invention, a thin flexible film is disposed on the top of the chuck so that the back surface of the substrate is drawn to the thin film and a force is applied to the thin film to resiliently deform the thin film to thereby deform the substrate. Accordingly, no concentrated force is applied to the substrate and the substrate can be deformed gently, so that the breaking of the substrate is prevented. Furthermore, in accordance with the present invention, by fixing the periphery of a circular thin film to the chuck body and arranging displacing means at a center thereof to displace it downward, it is possible to flatten the convex wafer exposure surface formed by a etching process after a lapping process to the flatness not more than ±3 μm. Thus, the wafer chuck mechanism can be simplified. When an air cylinder is used as the displacing means, the control of the air cylinder is simplified.

BRIEF DESCRIPTION OF THE DRAWINGS

FIG. 1 shows a schematic construction of a projection type light exposure device which is one example of the prior art devices.

FIGS. 2a and 2b illustrate a relationship between the flatness of a wafer and an image.

FIGS. 5a to 5d illustrate a principle of flattening a substrate by a substrate deformation correcting chuck shown in FIG. 4.

FIG. 6a is a partial cross-sectional view of a device for deforming the substrate at a substrate deformation correcting station in the light exposure device of FIG. 4.

FIG. 6b shows a front view, partly in section, of FIG. 6a.

FIG. 9a shows a plan view of a substrate deformation correcting chuck which is different from that shown in FIG. 6a.

FIG. 10 shows a front view of a substrate deformation correcting chuck and a substrate deformation measuring device shown in FIG. 4 as well as another embodiment of a controller.

DETAILED DESCRIPTION OF THE PREFERRED EMBODIMENTS

Figure 3:
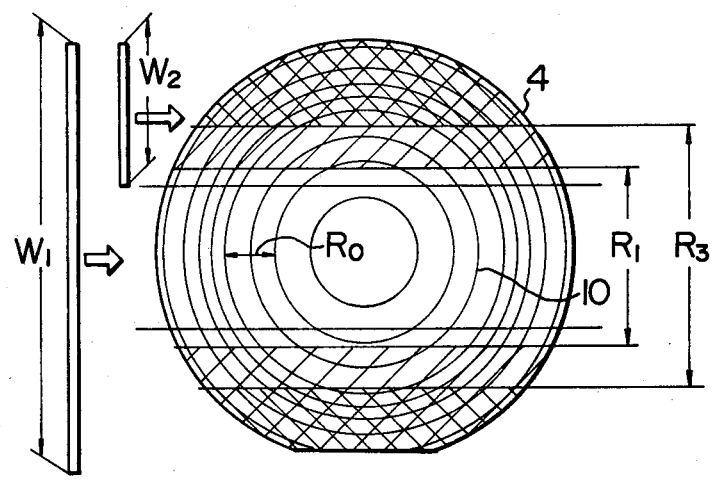
FIG. 3 is a chart for explaining a divided exposure.
Figure 4:
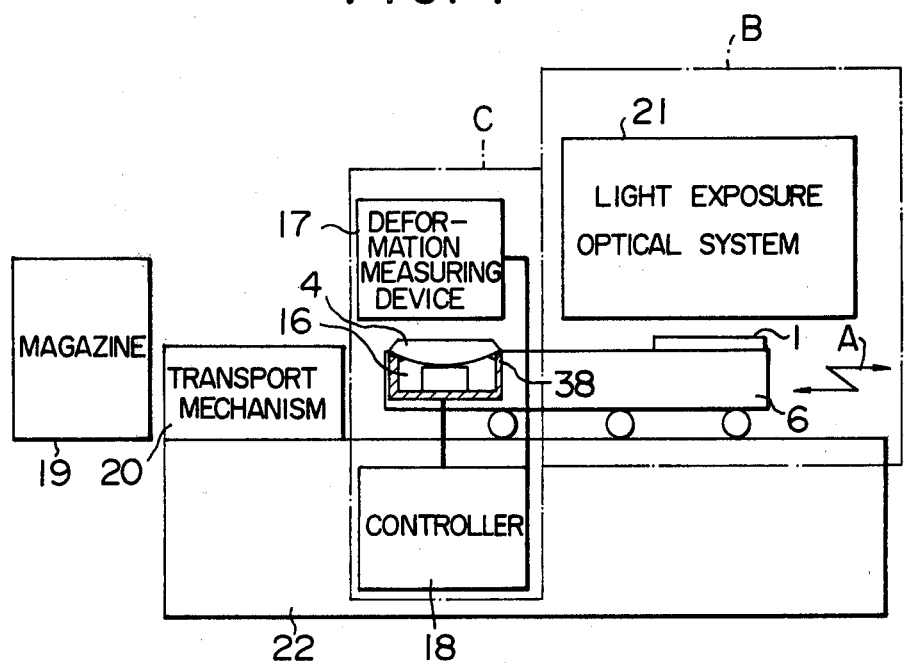
FIG. 4 shows a schematic construction of one embodiment of the light exposure device in accordance with the present invention.
Figure 7A:
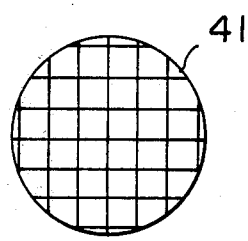
FIGS. 7a to 7f show arrangements of vertically moving blocks and vertical displacing devices shown in FIG. 6.
Figure 7B:
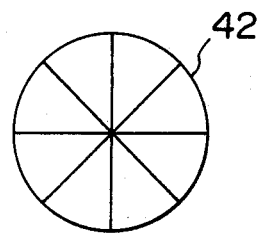
Figure 7C:
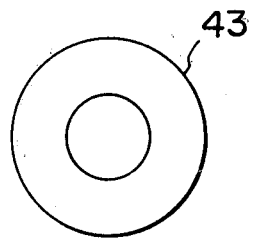
Figure 7D:
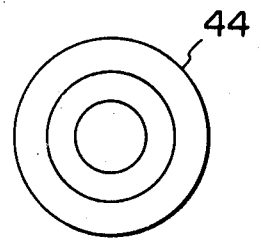
Figure 7E:
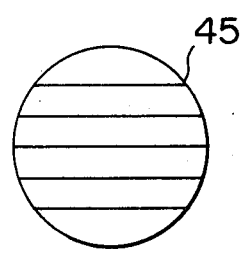
Figure 7F:
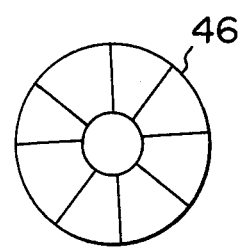

Referring now to overall schematic view of a light exposure device of the present invention in FIG. 4, according to this figure, a substrate or wafer 4, on which a semiconductor integrated circuit is formed, is arranged on a substrate deformation correcting chuck 16 which has a function to correct warp or bend of the substrate 4. The substrate deformation correcting chuck 16 is positioned by positioning means (not shown) to a carriage 6 which is reciprocally slidable on a base 22 between a substrate deformation correcting station C and an exposure and print station B. A device 17 for measuring deformation (flatness) on the surface of the substrate 4 is mounted at the substrate deformation correcting station C. At the substrate deformation correcting station C, deformation information (flatness information) of the surface of the substrate 4 obtained from the substrate deformation measuring device 17 is fed back to the substrate deformation correcting chuck 16 to deform the surface of the substrate 4 to conform to an image surface of a mask pattern. When the image surface of the mask pattern is flat, the surface of the substrate 4 is also made flat and horizontal. After the above step, the substrate 4 and the substrate deformation correcting chuck 16 are moved and set in the exposure station B, where a light exposure system 21 for exposing a pattern of a photomask is located so that the pattern is exposed to the substrate 4. More particularly, the light exposure apparatus comprises the substrate deformation correcting chuck 16 having one or more displacing devices for deforming the wafer or substrate 4 to flatten it with respect to a body 38, the deformation measuring device 17, a controller 18 for the displacing means, the scanning carriage 6 which carries the substrate 4 and the mask 1, a magazine 19 for housing cartridges which store the substrates 4 printed or to be printed, a transport mechanism 20 for transporting a selected substrate between the magazine 19 and the substrate deformation correcting chuck 16, the light exposure optical system 21 and a base 22. The wafer or substrate 4 which has been previously flattened is set on the substrate defromation correcting chuck 16, and the deformation measuring device 17 detects the deformation such as warp or bend of the chucked substrate 4, and the controller 18 calculates a necessary amount of displacement, which activates the displacing device of the substrate deformation correcting chuck 16 to deform the substrate 4 to conform to the image surface of the mask pattern (which is the imaging plane of the mask pattern in the light exposure device, and an imaging plane equally spaced from the mask and the wafer over the exposure region in the X-ray exposure device). In the illustrated example, since the mask has a high degree of flatness, the substrate 4 is flattened.

The deformation measuring device 17 then checks the flatness and if it is not within an allowable range the displacing device is finely vertically adjusted a predetermined number of times to repeatedly deform the wafer 4, and, when the wafer 4 comes within the allowable range, the carriage 6 is moved beneath the light exposure optical system 21 and a stage supporting the chuck is moved in X, Y and $\theta$ (rotation) directions relative to the mask 1 to align them to each other while non-exposure light is illuminated to an alignment target pattern. After the alignment has been attained, the pattern of the mask 1 is printed. The printed wafer or substrate is carried to the magazine 19 by the transport mechanism 20. The above step is repeated until unprinted substrates are exhausted. Preferably, the substrate 4 is deformed to conform to the image plane of the mask pattern when it is printed. In the light exposure device, the image plane of the mask pattern is flat. If it is sufficiently flat with a required accuracy, the substrate 4 is deformed to conform to the flat surface. When it is deformed to conform to the image plane, means (not shown) for detecting the image plane are required. It may be attained by illuminating non-exposure light and detecting the image on the substrate 4 produced by the mask pattern through the light exposure optical system 21, by a detecting optical system (not shown) comprising a focusing lens and a self-scanning solid-state imaging device, while the displacing device 16 is activated. More simply, the flatness of the mask 1 is detected to determine a deviation from the image point in a flat condition and the wafer 4 is deformed to conform to the deviated image point calculated based on reference points on the wafer 4 and the bend of the wafer surface.

FIGS. 5a to 5d illustrate a principle of the operation of the substrate deformation correcting chuck 16. When a convex substrate 4 shown in FIG. 5a is acted upon by a suction or vacuum from a conventional flat vacuum chuck 23, as shown in FIG. 5b, the top surface 11 of the substrate 4 presents a convex shape. When the substrate 4, which can take any shape in accordance with the thickness of the substrate, is sucked by a chuck 24, as shown in FIG. 5c, the top surface 11 of the substrate 4 is made flat. A force for deforming the substrate 4 in the present example is the atmospheric pressure represented by the arrow 25 created by the vacuum force of the chuck 24 which pushes the substrate to the chuck 24. Other types of deformation forces may include an electrostatic force, an adherence force, a force due to contact a the top surface 11 of the substrate 4 or a force applied to a periphery of the substrate 4. The deformation of the substrate 4 is determined by an elastic deformation coefficient of the substrate 4 and a deformation curve of the substrate 4 which depends on the deformation force. When the deformation force is small, as represented by the arrow 26 in FIG. 5d, the deformation may not conform to the chuck 24. A certain substrate 4 such as a wafer usually presents the deformation of approximately 10 $\mu$m and the shape thereof can be approximated by a square curve within $\pm 2$ $\mu$m error. Therefore, the deformation by atmospheric pressure 25 can be used.

FIGS. 6a and 6b show an embodiment in which the substrate deformation check is deformed by vertically moving segments thereof so that a convex substrate is deformed to a flat shape. Displacing devices 36 each comprising a motor 33, a gear 34 and a block 35 coupled to a lead screw as shown in FIG. 6b are provided one set for each of the segments of the substrate shown in FIG. 6a. Each segment has the independent displacing devices 36, gap detectors 37 associated with the displacing device 36, a chuck body 38 including the displacing devices 36 therein for chucking the substrate 4, a pipe 81 for evacuating the chuck body 38 through a vacuum pipe (not shown), a controller 39 for processing the outputs of the gap detectors 37 to determine the amount of vertical movement of the displacing device 36, and a driver 40 for driving the motors 33.

The substrate 4 is vacuum-drawn to follow the shape of the displacing devices 36. The surface 11 of the substrate 4 is moved upward or downward by the respective displacing devices 36. After the flatness of the top surface 11 of the substrate 4 has been detected, the motors 33 are driven in dependence upon the correction amounts and the rotational speed of the motors 33 are reduced by the reduction gears 34 which drive the lead screws which, in turn, move the blocks 35 upward or downward. When the motors 33 are D.C. motors, a reduction gear ratio of one to 10,000–100,000 is needed. When they are pulse motors, they have to control the blocks 35 by approximately 0.5 $\mu$m step and they do not need large reduction gear ratio. The D.C. motors can be readily controlled by closed loops including the detectors 37, while the pulse motors can be controlled by open loops. The pulse motors are larger than the D.C. motors and generate heat even in stopped condition. For both types of motors, backlash or play needs to be eliminated or minimized to a controllable amount.

The top surface of the substrate deformation correction chuck is defined by a plurality of the blocks 35 each of which is independently vertically displaceable by a small amount by the displacing device 36. The chuck body 38 has a flange of circular, rectangular or other similar shape at a periphery thereof, and the substrate 4 is mounted on the flange and the blocks 35. The vacuum pipe 81 and the tube are connected to the chuck body 38 and the tube is connected to the vacuum source (not shown).

While the substrate 4 is drawn downward by the vacuum, the blocks 35 are driven upward or downward by small amounts by a feed back to the displacing devices 36 of the flatness signals detected as respective points of the substrate 4 corresponding to the block positions by the deformation measuring devices 17, so that the substrate surface is flattened even when the substrate surface includes unevenness, warp or bend or the existence of foreign materials between the substrate 4 and the blocks 35.

The displacing device 36 may be the screw coupled to the motor as described above, or it may be a fine displacing mechanism using electrostrictive element, magneto-strictive element, thermal deformation element, magnets, fluidic devices or levers, or any combination thereof. When the substrate 4 is a wafer, a stroke of 30 $\mu$m and a positioning accuracy of no more than $\pm 1$ $\mu$m are required and a deformation rate must be higher in terms of a throughput and be stable at the time of printing.

The measurement of the deformation of the substrate 4 may be made by serially measuring a plurality of points by a single measuring element or by a parallel measuring of those points by a plurality of measuring elements.

In any case, it is essential to measure the flatness at each point on the surface of the substrate 4 corresponding to each of the positions of the blocks 35 by any of the above measuring devices and the measuring methods.

Figure 8:
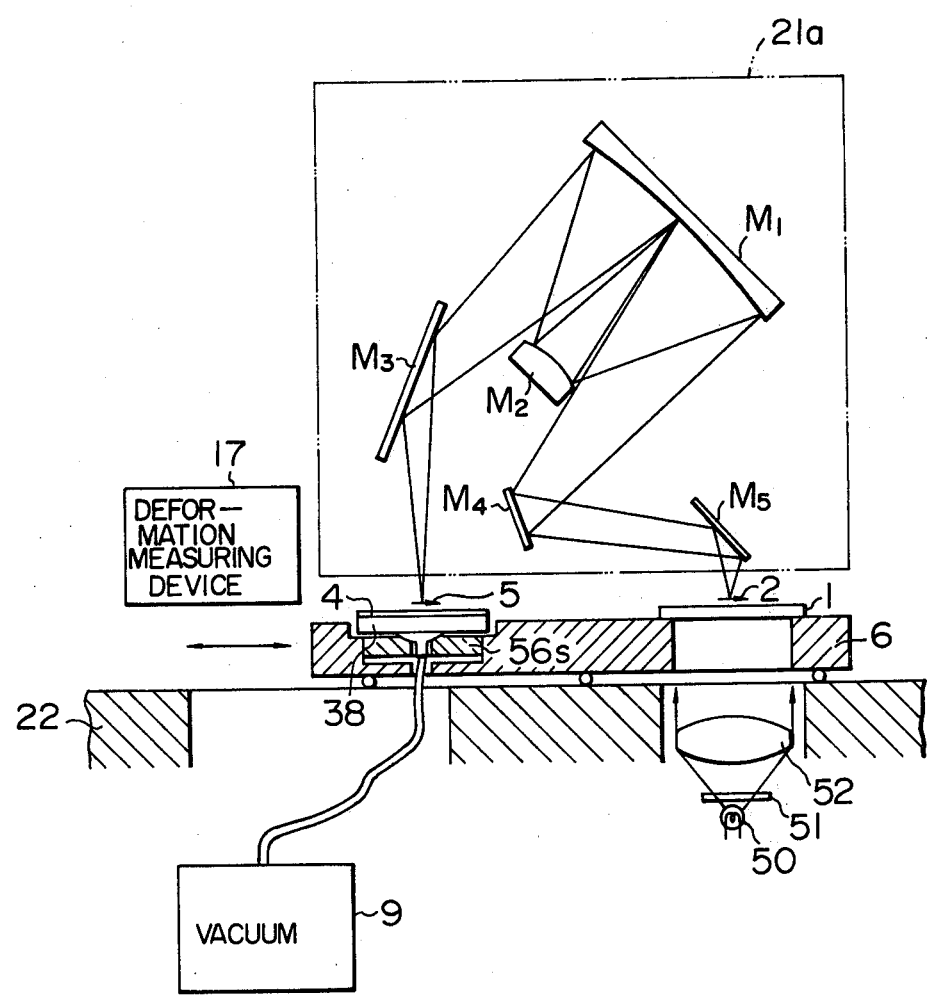
FIG. 8 shows detail of the projection type light exposure device mounted at an exposure station shown in FIG. 4.

The light exposure device, mounted at the light exposure station B, may be a contact type light exposure device which exposes light with the photomask and the substrate being in contact, or another type light exposure device which exposes a pattern by irradiating ultra-violet ray, and for ultra-violet ray or X-ray, the photomask and the substrate are spaced from each other by several microns to several tens microns. Another light exposure device which may be used in a projection type light exposure device shown in FIG. 8, wherein light emitted from an exposure light source 50 is converted to ultra-violet ray or far ultra-violet ray by a filter 51, which ray is collimated by a collimator lens 52 and then irradiated to a photomask 1 so that a pattern 2 of a semiconductor IC or the like on the photomask 1 is imaged on the substrate 4 as a pattern 5 through a projection optical system 21a comprising plane mirrors $M_5$ and $M_4$, a concave mirror $M_1$, a convex mirror $M_2$ and a plane mirror $M_3$. In this manner, the pattern is exposed to the substrate 4.

As shown in FIGS. 7a to 7f, the shape of the blocks may be grid segments 41, radial segments 42, concentric segments 43, multi-concentric segments 44, parallel segments 45 or concentric and radial segments 46.

Figure 9A:
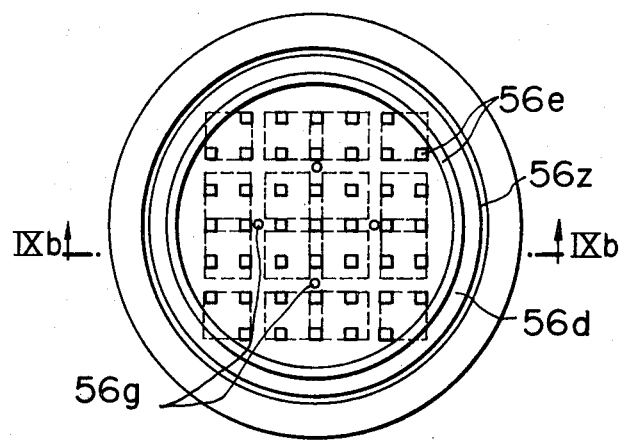
Figure 9B:
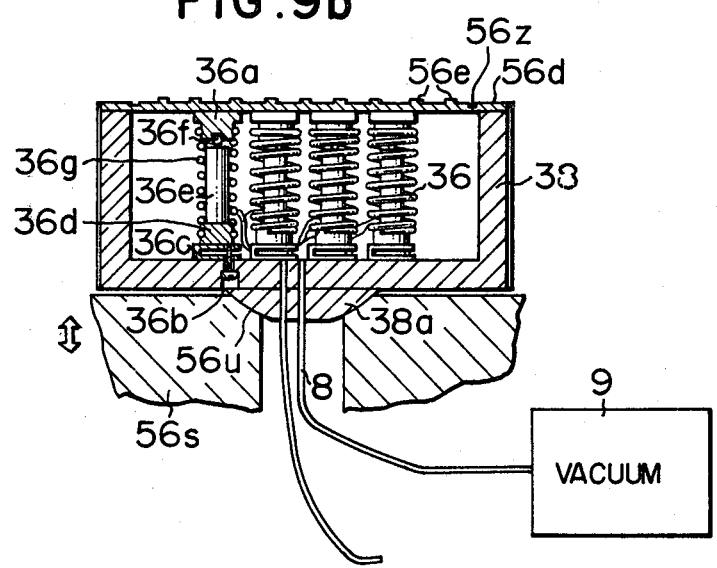
FIG. 9b shows a sectional view of FIG. 9a taken along a line IXb—IXb.

As shown in FIGS. 9a and 9b, a thin film 56d to be described more fully hereinbelow, and similar to the film in FIGS. 10 and 11, may be applied over the displacing devices 36. The displacing device 36 may comprise a member 36a bonded to the bottom surface of the thin film 56d, a U-shaped member 36c which is clamped to the chuck body 38 and level-ajustable by a screw 36b, a member 36d clamped to the member 36c, a piezoelectric element 36e having its lower end fixed to the member 36d, a ball 36f disposed between the upper end of the piezoelectric element 36e and the lower end of the member 36a and a spring 36g for tensioning the member 36a and the member 36d. A sphere 38a is mounted on the bottom surface of the chuck body 38. A stage 56s which supports the sphere 38a of the chuck body 38 by a spherical seat 56u is movable upward and downward by a lead screw mechanism, not shown. Since the substrate 4 is deformed through the thin film 56d while the substrate 4 is acted upon by suction and held by the thin film 56d, no localized stress is applied to the substrate 4 and the breaking of the substrate is prevented and the exposure surface of the substrate 4 can be smoothly deformed to conform to a desired shape.

As an alternative to the displacing device 36, vacuum pressures to a plurality of chambers may be so as to deform the thin film 56d in the shape of diaphragm. Bore 56g are provided for enabling the substrate 4 to be drawn to the thin film 56d.

The substrate deformation measuring device 17 may be of contact type or non-contact type. The contact type includes a dial gauge device and the non-contact type includes an air micrometer, electromagnetic device, static capacitance device, and optical device.

Figure 11:
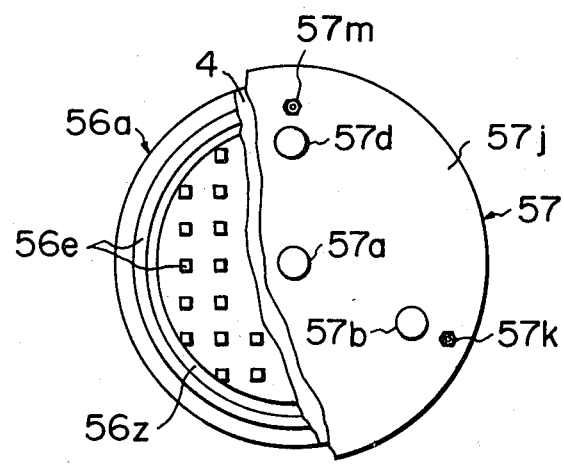
FIG. 11 is a fragmentary sectional view of FIG. 10 taken along a line XI—XI.

Referring to FIGS. 10 and 11, preferred embodiments of the deformation measuring device 57(17), the substrate deformation correcting chuck 56(16) and the controller 58(17) are explained. The substrate deformation correcting chuck 56 is made of a thin, flexible metal plate such as steel, aluminum, stainless steel, phosphor bronze or silicon, having a thickness of 0.4–3 mm, a thin glass plate having a thickness of approximately 0.7 mm, or a thin resin plate such as Teflon. It has a ring-shaped ribs 56e of approximately 50–100 μm height around an outer periphery thereof and regularly arranged within the outer periphery. A chuck body 56a, having a flexible wafer chuck surface 56d integrally fixed to the upper end of a cylinder 56b, is mounted inside the rib 56e. The rib 56e may be of square shape or circular shape. In order to support the periphery of the wafer chuck surface 56d substantially freely, a ring-shaped groove 56z is formed to reduce the thickness. In order to eject the exposed wafer 4 by an air jet force, an obliquely oriented transport hole 56y is formed in the flexible wafer chuck surface 56d, with the hole 56y is connected to a path 56x formed in the chuck body 56a. The path 56x is connected to a vacuum source 56v through a flexible pipe 56w. A shaft 56c, having a suction hole 56f therein, is integrally fixed to the lower end of the wafer chuck surface 56d in the center area thereof. An opening 56g connected to the suction hole 56f of the shaft 56c is formed at the center of the chuck surface 56d and connected to a groove formed around the rib 56e. The suction hole 56f is connected to a vacuum source 56h through a flexible pipe 56i.

The wafer deforming device includes a displacing unit 56j and an air supply source 56q. The displacing unit 56j comprises a block 56k in the chuck body 56a, a cylinder chamber 56l formed in the block 56k, ports 56m and 56n which extend from the top and the bottom of the cylinder chamber 56l to the external of the chuck body 56a through the block 56k, and a piston 56p integrally mounted to the shaft 56c and inserted in the cylinder chamber 56l. Connected to the air supply source 56q is a pipe 56r toward the displacing unit 56j. The pipe 56r includes a pressure control valve 58b which forms the control means 58, and a direction selection valve 58a. The ports 56m and 56n connected to the cylinder chamber 56l are independently connected to output ports of the direction selection valve 58a. The air pressure supplied from the air supply source 56q is adjusted by the pressure control valve 58b and fed to the port 56m or 56n selected by the direction selection valve 58a so that the piston 56p is moved upward or downward to move the shaft 56c upward or downward. As a result, a load is applied to the center of the thin flexible plate (chuck surface) 56d having its periphery fixed, to create deformation w given by a formula (1) so that the surface of the wafer 4 is flattened in accordance with the following relationship.

$$w = \frac{Pa^2}{16\pi D}\left\{1 - \left(1 + 2\log\frac{a}{r}\right)\frac{r^2}{a^2}\right\} \quad (1)$$

where:

P is a load applied to the center of the thin plate 56d, $D = Eh^2/12(1-v^2)$,
h = thickness of the plate,
E = longitudinal elastic coefficient,
v = Poisson's ratio,
a = fixed radius of the thin plate,
r = variable radius of the thin plate 56d As shown in FIG. 10, motor 59b is driven by an instruction from a motor drive circuit 59a, and a lead screw mechanism (not shown) coupled to an output shaft of the motor 59b moves the stage 56s mounted on the carriage 6 by a predetermined distance upward or downward as represented by an arrow. A spherical seat 56u is formed at the top end of the center of the stage 56s. The ball 56t mounted at the bottom of the chuck body 56a is engaged with the spherical seat 56u so that the ball may be rotated before it is fixed by the vacuum suction means (not shown).

The deformation measuring device 57 comprises an air supply source 17j, a plate 57j fixed to the base at the substrate deformation correcting station, air micrometers 57a, 57b, 57c and 57d which function as deformation detecting elements and are arranged on the plate 57j at the center of the wafer 4 and peripheral positions spaced by 120 degrees from each other with the air micrometers 57a–57d being spaced from the surface of the wafer 4 which is drawn to the chuck surface 56d. Leveling pads 57k, 57l and 57m (FIG. 11 are arranged on the plate 57j at positions corresponding to the positions of the air micrometers 57a, 57b, 57c and 57d for leveling the wafer 4, with transducers 57e, 57f, 57g and 57h being coupled to the air micrometers 57a to 57d to transduce air pressure to voltage. A processing unit 57i is provided for processing the outputs of the transducers 57e to 57h and to provide a concave/convex signal and a wafer surface warp signal to the controller 58. The air supply source 17j supplies air of a fixed pressure to the air micrometers 57a to 57d through a pipe 57' and the air micrometers 57a to 57d detect air pressures which vary depending on distances $h_1$ to $h_4$ from the ends of the air micrometers 57a–57d to the surface of the wafer 4. The detected air pressures are transduced to voltages by the transducers 57e to 57h and the voltages are supplied to the processing unit 57i, which discriminates concave or convex surface based on the signals $V_1$–$V_4$ from the transducers 57e to 57h and determines the amount of warp, and based on those results, controls the control means 58.

The control means 58 of the wafer deforming means comprises the direction switching valve 58a, provided in the pipe 56r extending from the air supply source 56q to the cylinder chamber 56l of the displacing unit 56j, a pressure control valve 58b, provided upstream of the valve 58a, controllers 58c and 58d, a motor 58e, connected to the controller 58d, and gears 58g and 58f arranged between an output shaft of the motor 58e and a valve shaft of the pressure control valve 58b. The ports 56m and 56n of the displacing unit 56j are independently connected to output ports of the direction switching valve 58a through flexible pipes to selectively open the port 56m or 56n. Depending on the signal from the processing unit 57i of the deformation measuring means 57, the controller 58c controls the direction switching valve 58a to open the port 56m or 56n of the displacing unit 56j, and, depending on the signal from the processing unit 57i, the aperture of the pressure control valve 58b is adjusted through the controller 58d, motor 58e, and gears 58g and 58f to control the amount of movement of the piston of the displacing unit 56j.

The operation for flattening the wafer surface is now explained. The wafers 4, housed in the magazine 19 are taken out one at a time by the transport mechanism 20, and coarse positioning means (not shown) mounted in the transport mechanism 20 pushes flat area formed on the periphery of the wafer 4 to coarsely position it. The coarsely positioned wafer 4 is then mounted on the substrate deformation correcting chuck 56 disposed at the wafer deformation correcting station C by the transport mechanism 20 such as vacuum chuck which rocks in a horizontal plane. Then, the vacuum source 56h to the suction means is activated to draw and hold the wafer 4 to the chuck surface 56d. Then, the air supply source 17j of the deformation measuring device 57 for the wafer 4 supplies air of a fixed pressure to the air micrometers 57a to 57d, which detect the pressures which vary depending on the distances $h_1$ to $h_4$ from the surface of the wafer 4. Those pressures are transduced to the voltages $V_1$ to $V_4$ by the transducers 57e to 57h. The processing unit 59c issues an instruction to raise the stage 56s to the motor drive circuit 59a to raise the stage 56s. The motor drive circuit 59a drives the motor 59b to raise the stage 56s by the lead screw mechanism (not shown). Thus, the areas on the surface of the wafer 4 sequentially abut against the leveling pads 57k, 57l and 57m and the wafer 4 is automatically centered by the sphere 56t and the spherical seat 56u. In this manner, the wafer 4 is leveled. More particularly, when the surface of the wafer 4 abuts against the leveling pads 57k to 57m, the transducers 57e to 57h connected to the air micrometers 57a to 57d produce no output variation. The processing unit 59c detects this output state to stop the motor 59b through the motor drive circuit 59a which, in turn, results in a stopping in the raising of the stage 56s. In this manner, the wafer 4 is leveled. After the leveling of the wafer 4, the sphere 56t and the spherical seat 56u are fixed by air suction force.

The correction of the deformation of the wafer surface is now explained. When the surface of the wafer 4 is not flat as shown by a phantom line in FIG. 10, the air micrometers 57a to 57d detect different distances $h_1$ to $h_4$ between the ends of the air micrometers 57a to 57d and the surface of the wafer 4. The pressure transducers 57e to 57h produce the voltages $V_1$ to $V_4$ corresponding to the distances $h_1$ to $h_4$.

The shape of the wafer 4 is determined in the following manner. The processing unit 57i calculates $$V_c = \frac{3V_1}{V_2 + V_3 + V_4}$$

based on the voltages $V_1$, $V_2$, $V_3$ and $V_4$, and if $V_c \geq 1$, the processing unit 57i determines that the shape of the wafer is convex upward, and if $V_c < 1$ it determines that the shape thereof is concave downward. The wafer 4 is formed by slicing a block into a thin wafer by a dicing saw, lapping the surface of the wafer and etching off the surface layer of the lapped wafer. Since the surface of the wafer 4 is lapped and etched, the periphery of the wafer 4 is usually more treated than the center area thereof so that the surface of the wafer 4 presents the convex shape as shown by phantom line in FIG. 10. Consequently, the processing unit 57i produces a signal representing $V_c > 1$, which causes the controller 58c to actuate the direction switching valve 58a so that the port 56m which leads to the top of the cylinder chamber 58l of the displacing unit 56j is opened.

The processing unit 57i carries out the following control and processing operation. If it is desired to keep the flatness of the surface of the wafer 4 within 3 μm, for example, a reference voltage $V_D$ corresponding to the premeasured distances between the ends of the leveling pads 57k, 57l and 57m and the ends of the air micrometers 57a to 57d, and an allowable deformation voltage $V_\mu$ corresponding to 3 μm are applied to the processing unit 57i, which calculates $$V = V_D - \frac{KV_1 + V_2 + V_3 + V_4}{6}$$

(where K is a weighting factor, e.g. 3) and determines if $-V_\mu < V_b - V_1 < V_\mu, -V_\mu < V_D - V_2 < V_\mu, -V_\mu < V_D - V_3 < V_\mu$ or $-V_\mu < V_D - V_4 < V_\mu$. The air supply source 56q is then activated to supply air to the upper port of the cylinder chamber 56l through the port 56m so that the piston 56p is moved downward through the shaft 56c. The processing unit 57i supplies the signal V to the controller 58d of the control means 58 so that the opening of the pressure control valve 58b is sequentially adjusted by the motor 58e and the gears 58f and 58g. When the conditions of $-V_\mu < V_D - V_1 < V_\mu$, $-V_\mu < V_D - V_2 < V_\mu$, $-V_\mu < V_D - V_3 < V_\mu$ and $-V_\mu < V_D - V_4 < V_\mu$ are met, the adjustment of the pressure control valve 58b is stopped, the chuck surface 56d is deformed to present a concave shape, and the surface of the wafer 4 is flattened as shown by a solid line in FIG. 10. When the wafer 4 presents a concave shape as opposed to the previous case, the surface of the wafer 4 can be flattened similarly. While the illustrated embodiment includes one shaft 56c and one piston 56j, more than one shaft 56c and piston 56j may be provided. In this case, the wafer 4 can be deformed to conform to the image surface of the mask pattern or uniformly spaced from the mask with high accuracy even when the surface of the wafer 4 is twisted.

Figure 12:
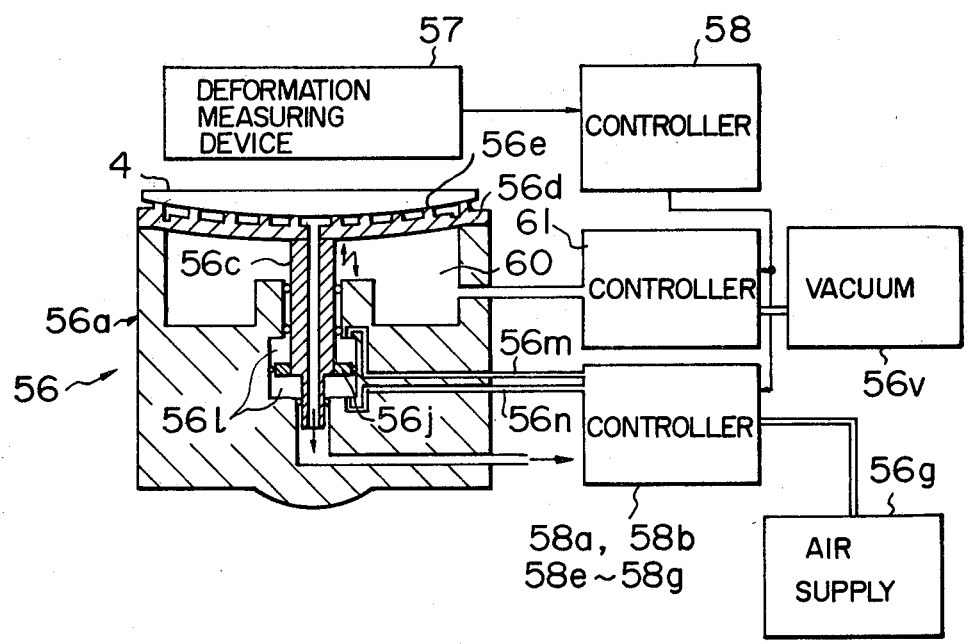
FIG. 12 shows a front view of a substrate deformation correcting chuck which is different from that shown in FIG. 10.
Figure 13A:
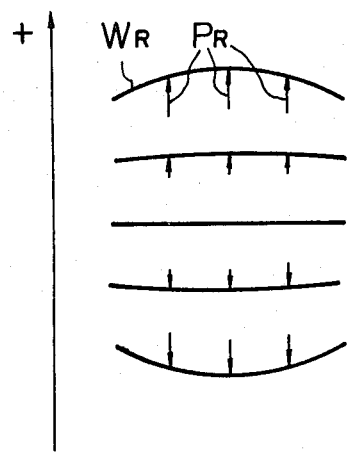
FIGS. 13a to 13c show deformations of the chuck surface of the chuck shown in FIG. 12.
Figure 13B:
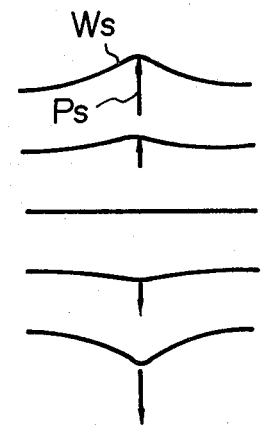

Referring to FIG. 12, another embodiment of the substrate deformation correcting chuck 16 is explained. The substrate deformation correcting chuck shown in FIG. 12 is characterized by dispensing with the obliquely oriented transport hole 56y for ejecting the wafer 4 in the embodiment shown in FIG. 10 and by connecting a controller 61 which controls the pressure of a deforming air chamber 60 formed on a back side of the wafer chuck surface 56d to the controller 58. That is, the pressure $P_R$ (FIG. 13a) of the deforming air chamber 60 which is controlled by the controller 61 and a pressure $P_S$ (FIG. 13b) due to the vertical movement of the shaft 56c, controlled by the direction switching valve 58a, pressure control valve 58b, motor 58e, and gears 58f, 58g, are used in combination. The resiliently deformable surface of the chuck surface 56d deforms, as shown by $W_R$ in FIG. 13a, when only the pressure $P_R$ of the deforming air chamber 60 is applied, and it deforms, as shown by $W_S$ in FIG. 13b, when only the pressure $P_s$ due to the vertical movement of the shaft 56c is applied. By applying both pressures, the chuck surface 56d deforms as shown by W in FIG. 13c, which is represented by the following relationship;

$$W = W_R + W_S \tag{2}$$

Figure 13C:
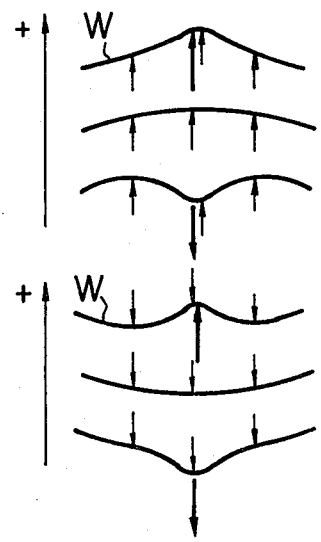

The deformation may be the one intermediate those shown in FIG. 13c. The deformation W may be expressed by:

$$W = W_V - W_F \tag{3}$$

where $W_F$ is the deformation of the top surface of the wafer on the flat chuck, and $W_V$ is the deformation of the top surface of the wafer on the chuck. Then, a condition $$W \leq d \tag{4}$$

is to be met, where d is an allowable flatness. From the formulas (2), (3) and (4), an optimum deformation of the chuck surface 56d is determined. The deformation measuring device 57 performs the above calculation and the controller 58 feeds back the results to flatten the wafer 4. In this manner, even a generally convex and centrally concave wafer 4 can be flattened.

Figure 14:
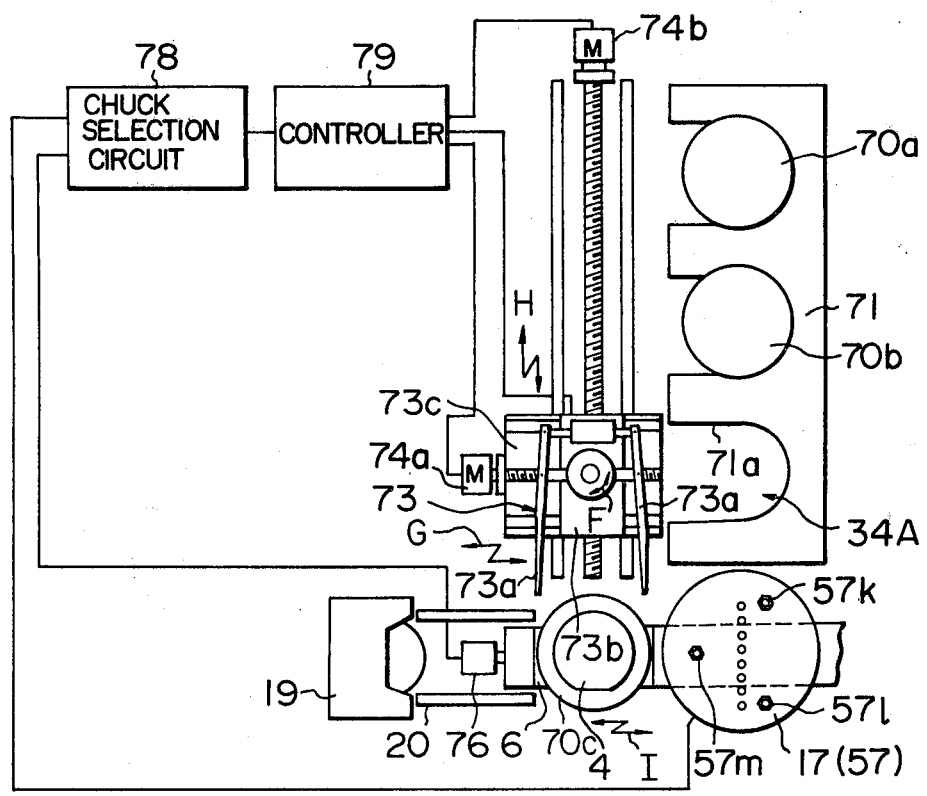
FIG. 14 shows a schematic construction of a further embodiment of the substrate deformation correcting chuck shown in FIG. 4.
Figure 15:
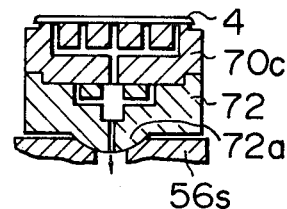
FIG. 15 shows a sectional view of the chuck shown in FIG. 14.
Figure 16A:
FIGS. 16a to 16c show sectional views of various exchangeable chucks mounted in exchanging chuck magazines shown in FIG. 14.
Figure 16B:
Figure 16C:

Another embodiment of the substrate deformation correcting device is explained with reference to FIGS. 14, 15 and 16 and, according to these figures a chuck magazine 71 is adapted to accommodate a plurality of exchangeable chucks 70a to 70c as shown in FIGS. 16a–16c. A chuck transport means is provided for transporting the chuck 70a–70c, with the chuck transport means including a chuck handling mechanism generally designated by the reference numeral 73, motors 74a and 74b, and a controller 79, controlling the for transporting the exchangeable chucks 70a to 70c from the chuck magazine 71 to a chuck base 72 (FIG. 15) and transporting them back to the original locations after they have been used. A magazine 19 is provided for accomodating unprinted wafers 4, with a wafer loader/unloader (transport mechanism) 20 being provided for mounting or dismounting a selected one of the wafer 4 on or from the magazine 19. A carriage 6 carries the mask and the wafer 4, with drive means 76 driving the carriage 6. A deformation measuring device 17(57) measures the deformation of the wafer 4 on the chuck by a plurality of aligned air micrometers or static capacitance detectors, with a chuck selection circuit 78 determining the shape of the wafer 4 based on the measurements by the deformation measuring device 17(57) to select an exchange chuck 70a–70c which has a shape substantially complementary to the shape of the wafer 4. A control unit 79 controls the chuck transport means based on the signal from the chuck selection circuit 78.

More particularly, the exchangeable chucks 70a to 70c include the chuck 70c having a flat top surface and the chucks 70a and 70b having upwardly concave top surfaces of different radii of curvature, all of which are of stepped cylindrical shape. The chuck magazine 71 has a plurality of chuck accommodating grooves 71a, one for each of the exchangeable chucks 70a–70c, opened toward the chuck handling mechanism 73. The width of the chuck accommodating grooves 71a is selected so as to allow slidable movement of a reduced diameter portion of the exchangeable chucks 70a–70c. The chuck handling mechanism 23 comprises a pair of arms 73a for releasably holding the exchangeable chuck 70a, 70b or 70c, a first support member 73b for pivotably supporting the arms 73a within a substantially right angle as shown by an arrow F, a second support member 73c for detachably supporting the exchangeable chuck 70a, 70b or 70c along the chuck accommodating groove 71a, and a motor 74b for reciprocably moving the second support member 73c in the direction of the arrow H, that is, in the direction of arrangement of the exchangeable chucks 70a to 70c. The carriage 6, having the chuck base 72 mounted thereon is driven by the drive source 75 in the direction of the arrow I, that is, in parallel to the direction the arrow G. The top of the chuck base 72 has a complementary shape to the stepped portion of the exchangeable chuck 70a, 70b or 70c so that it closely abuts against the chuck 70a, 70b or 70c. As shown in FIG. 15, suction acts upon the wafer 4 through an air hole formed in the chuck base 72 and an air hole formed in the exchangeable chuck 70a, 70b or 70c. The deformation measuring device 17(57) detects the level of the surface of the wafer 4 in synchronism with the movement of the carriage 6. The chuck selection circuit 78 performs the calculation to be described later based on the detected signal and provides an exchangeable chuck selection signal, optimum to the particular wafer, 4 to the chuck transport means.

The function of the wafer chuck device of the present invention will now explained.

Figure 17A:
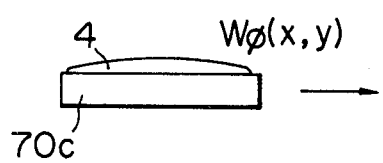
FIGS. 17a to 17c show wafers mounted on and sucked by the exchangeable chuck shown in FIGS. 16a to 16c.
Figure 17B:
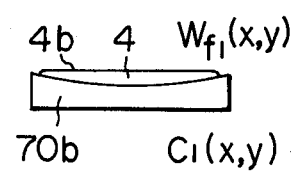
Figure 17C:
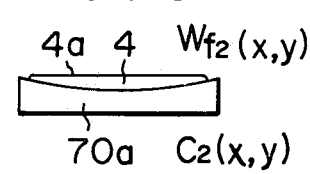
Figure 18:
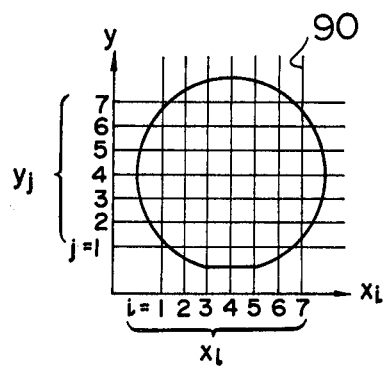
FIG. 18 shows a point at which the deformation of the wafer is measured by the wafer deformation measuring device shown in FIG. 14.

The chuck magazine 71 selects one of the chucks 70a to 70c and mounts the selected chuck on the chuck base 72 attached to the carriage 6. This operation is carried out by the selection means and the transport means by depressing a control button (not shown). The wafer 4 is taken out from the magazine 19 and mounted on the chuck base 72. The wafer 4 is then acted upon by a suction supplied by the vacuum source. The carriage 6 is moved to position the wafer 4 directly beneath the substrate deformation measuring device 17(57) and the stage 56s (FIG. 15), supporting the chuck base 72, is raised to bring the top surface of the wafer 4 into contact with the bottoms of the leveling pads 57k to 57m. Rotational movement is imparted between the sphere 72a at the bottom of the chuck base 72 and the spherical seat of the stage 56s to level the wafer 4. Then, the sphere 72a and the spherical seat of the stage 56s are fixed by the vacuum force. Then, the stage 56s is lowered by a predetermined distance and the wafer 4 on the carriage 6 is scanned while controlling the drive means 76. The deformation measuring device 17(57) detects the deformation over the entire wafer surface in synchronism with the movement of the carriage 6. The resulting data for the upwardly convex shape, for example, as shown in FIG. 17a, is expressed by the relationship $W_\phi$ (x, y) and is recorded for each crosspoint on a grid 90 shown in FIG. 18 in which the direction of scan of the carriage 6 is represented by x, and the direction normal to the direction of scan is represented by y. Based on the data $C_1$ (x, y) and $C_2$ (x, y) of the flatness of the surface of the exchangeable chucks 70b (FIG. 17b) and 70a (FIG. 17a), the chuck selection circuit 78 calculates the flatnesses of the wafers 4b and 4a when they are drawn to the chucks 70b and 70a, respectively, by the following formulas:

$$W_{f1}(x, y) = W_\phi(x, y) + C_1(x, y)$$

$$W_{f2}(x, y) = W_\phi(x, y) + C_2(x, y)$$

From the $W_{f1}$ and $W_{f2}$, an area $S_F$, which lies in a depth of focus ($W_{F1} - W_{F2}$), is calculated by the following formula:

$$S_F = |x_i, y_i| \text{ for } |(x_i, y_i)| W_{F1} \leq W_f(x_i, y_i) \leq W_{F2}$$

$W_{f1}$, $W_{f2}$ and $W_\phi$ are placed in the above formula to select the exchangeable chuck 70a, 70b or 70c having the largest $S_F$.

If the flat chuck 70a, 70b, 70c has the largest $S_F$, the wafer 4 drawn to the flat chuck is exposed and printed by the light exposure unit (not shown). The exposed and printed wafer 4 is removed from the flat chuck 70a, 70b or 70c by means (not shown).

As explained hereinabove, in accordance with the present invention, the LSI wafer having been subjected to various heat treatments and having warp or twist on the order of 100 μm, which was heretofore comformed to the image surface of the mask pattern to the closeness of 15-20 μm by the conventional process such as lapping or etching, can be deformed to conform to the image surface of the mask pattern within the accuracy of ±3 μm by the simple structure and process without sacrificing the output of processed wafers. As a result, a fine pattern on the order of 1-2 μm can be formed uniformly over the entire surface of the wafer and the yield of the LSI and the magnetic bubble device can be considerably improved.

What is claimed is:

1. A device for exposing and printing a predetermined pattern on an exposure surface of a substrate, the device comprising:
   measuring means for measuring a curvature of the exposed surface of said substrate,
   a chuck including a suction and holding means having a deformable member for drawing and holding a back surface of said substrate opposite to said exposure surface of said substrate, and deforming means for imparting a force to said deformable member and said back surface of said substrate to deform said substrate,
   control means for controlling said deforming means of said chuck in accordance with the curvature of said exposure surface of said substrate measured by said measuring means such that said exposure surface of said substrate conforms to an image surface of said pattern over an entire exposure area within a predetermined allowable error, and
   means for carrying and transporting said chuck in a substantially horizontal direction from a substrate deformation correcting station to an exposure station.

2. A device according to claim 1, wherein a plurality of said deforming means are arranged on the back side of said substrate within said chuck in any one of a line, point and rotational symmetrical relationship to a center of said substrate.

3. A device for exposing and printing a predetermined pattern on an exposure surface of a substrate, the device comprising:
   measuring means for measuring a curvature of the exposure surface of said substrate, said measuring means is arranged at a substrate deformation correcting station,
   a chuck including a suction and holding means for drawing and holding a back surface of said substrate opposite to said exposure surface of said substrate, and deforming means for imparting a force to said back surface of said substrate to deform said substrate,
   control means for controlling said deforming means of said chuck in accordance with the curvature of said exposure surface of said substrate measured by said measuring means such that said exposure surface of said substrate conforms to an image surface of said pattern over an entire exposure area within a predetermined allowable error, and
   a carriage means for carrying said chuck thereon, said carriage means being movable in a horizontal direction from said substrate deformation correcting station to an exposure station.

4. A device for exposing and printing a predetermined pattern on an exposure surface of a substrate, the device comprising:
  measuring means for measuring a curvature of said exposure surface of said substrate,
  a chuck including suction and holding means having a flexible plate disposed on a chuck surface to oppose a back surface of said substrate opposite to said exposure surface of said substrate to draw and hold a back surface of an entire exposure to draw and hold a back surface of an entire exposure area of said substrate to said flexible plate, a chuck body for supporting a periphery of the flexible plate, and deformation means for imparting a force to said flexible plate to deform said flexible plate thereby deforming said substrate drawn to and held by said suction and holding means, and
  control means for controlling said deformation means of said chuck in accordance with the curvature of said exposure surface of said substrate measured by said measuring means such that said exposure surface of said substrate conforms to an image surface of said pattern over the entire exposure area within a predetermined allowable error.

5. A device according to claim 4 wherein said flexible plate is circular and the periphery of said flexible plate is fixed to the chuck body to form said chuck surface.

6. A device according to claim 5 wherein said suction and holding means has regularly arranged grooves formed on a suction and holding surface of said flexible plate, said grooves being connected to a vacuum source.

7. A device according to claim 4 wherein said flexible plate has a ring-shaped thin groove around a periphery thereof to increase a strain at the periphery of said flexible plate.

8. A device according to claim 4 or 5 wherein said deformation means includes a cylinder having a piston inserted therein, an end of an output shaft of said piston being fixed to the back surface of said flexible plate, and said control means has pressure control means for controlling fluid pressure supplied to said cylinder.

9. A device according to claim 8 wherein said piston is disposed at a center of said flexible plate.

10. A light exposure device for exposing and printing a predetermined pattern on an exposure surface of the substrate, comprising:
  measuring means for measuring curvature of said exposure surface of said substrate,
  a chuck including suck and hold means having a flexible thin film disposed on a chuck surface to oppose to a back surface of said substrate opposite to said exposure surface of said substrate to suck and hold said back surface of said substrate to said thin film and deformation means for imparting a force to said thin film to deform said thin film to thereby deform said substrate sucked to and held by said suck and hold means, said deformation means has a cylinder having a piston inserted therein, an end of an output shaft of said piston being fixed to the back surface of said thin film, said thin film having an air chamber on a back surface thereof, and
  control means for controlling said deformation means of said chuck in accordance with the curvature of said exposure surface of said substrate measured by said measuring means such that said exposure surface of said substrate conforms to an image surface of said pattern over an entire exposure area within a predetermined allowable error, said control means has pressure control means for controlling fluid pressure supplied to said cylinder and a pressure controller for controlling air pressure supplied to said air chamber.

11. A device according to claim 4 or 5, wherein said deforming means comprises a plurality of regularly arranged piezoelectric elements, a top end of said piezoelectric elements rotatably engaging with the back surface of said flexible plate through a point contact element, and means for urging said flexible plate into a close contact through the point contact element between the top end of the piezoelectric elements and the back surface of the flexible plate.

12. A device for exposing and printing a predetermined pattern on an exposure surface of a substrate, the device comprising:
  measuring means for measuring a curvature of said exposure surface of said substrate, said measuring means is mounted on a base, at least three leveling pads are arranged on the base in opposition to the periphery of said exposure surface of said substrate,
  a chuck including suction and holding means having a flexible plate disposed on a chuck surface to oppose a back surface of said substrate opposite to said exposure surface of said substrate to draw and hold said back surface of said substrate to said flexible plate, and deformation means for imparting a force to said flexible plate to deform said flexible plate thereby deforming said substrate drawn to and held by said suction and holding means, said chuck further includes a sphere or a spherical seat at a bottom thereof,
  stage means for supporting said chuck, said stage means is adapted to be selectively raised and lowered and includes a spherical seat or a sphere at a top thereof, whereby when said stage means is raised, said stage means abuts against the periphery of said exposure surface of said substrate and said exposure surface of said substrate is rotated by said sphere of said spherical seat to level said exposure surface to said image surface of said pattern, and
  control means for controlling said deformation means of said chuck in accordance with the curvature of said exposure surface of said substrate measured by said measuring means such that said exposure surface of said substrate conforms to an image surface of said pattern over an extire exposure area within a predetermined allowable error.

13. A device according to claim 4 or 5, wherein said deformation measuring device comprises a plurality of air micrometers.

14. A device according to claim 12 wherein said deformation measuring means comprises a plurality of air micrometers with at least three of said air micrometers being disposed in close to said leveling pads.

15. A method for exposing and printing a predetermined pattern on an exposure surface of a substrate, the method comprising the steps of:
  interposing a thin flexible plate between a back surface of the substrate and a chuck means for holding the substrate,
  drawing and holding the surface of the substrate to the thin flexible plate,
  measuring a curvature of the exposure surface of the drawn and held substrate, and
  imparting a force to the thin flexible plate so as to deform the thin flexible plate and substrate in accordance with the measured curvature of the exposure surface of the substrate, and conforming the exposure surface of the substrate to an image surface of the pattern over an exposure area within a predetermined allowable error.

16. A method according to claim 15, further comprising the steps of moving the chuck means deformed into a desired shape to an exposure position, and exposing and printing the predetermined pattern on the exposure surface of the substrate.

17. A device according to claim 11, wherein said means for urging includes a tension spring arranged between the back surface of the thin plate and a lower end of said piezoelectric elements.

18. A device according to claim 4, further comprising chuck leveling means for rotating a base of the chuck to level a periphery of said exposure surface of said substrate to said image surface of said pattern.

19. A device according to one of claims 1, 4, 10, or 12, further comprising a magazine means for accommodating a plurality of chucks, the means for carrying and transporting includes a chuck handling mechanism for selectively transferring the respective chucks between the magazine means and the chuck base, and means for controlling the transferring of the respective chucks to and from the base in dependence upon a shape of the substrate.

20. A device according to claim 19, wherein the chuck handling mechanism includes a pair of arms for releasably holding the respective chucks, and means for positioning said arms so as to enable the respective chucks to be removed from and replaced in the magazine means.

21. A device according to one of claims 12 or 14, wherein said thin plate is circular and the periphery of said thin plate is fixed to the chuck body to form the chuck surface.

22. A device according to claim 11, wherein said point contact element includes a ball.

23. A device according to claim 4, wherein said deformation means has an air chamber on a back surface of the flexible plate of said chuck body, and said control means includes a pressure controller means for controlling air pressure supplied to said air chamber.

* * * * *